(12) United States Patent
Bertotti et al.

(10) Patent No.: US 6,236,225 B1
(45) Date of Patent: May 22, 2001

(54) METHOD OF TESTING THE GATE OXIDE IN INTEGRATED DMOS POWER TRANSISTORS AND INTEGRATED DEVICE COMPRISING A DMOS POWER TRANSISTOR

(75) Inventors: Franco Bertotti, Milan; Bruno Murari, Monza; Enrico Novarini, Certosa di Pavia, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/053,881

(22) Filed: Apr. 1, 1998

(30) Foreign Application Priority Data

Apr. 1, 1997 (EP) ................................................ 97830159

(51) Int. Cl.[7] .................................................. G01R 31/26
(52) U.S. Cl. ............................................ 324/769; 324/765
(58) Field of Search .................................. 324/765, 768, 324/769

(56) References Cited

U.S. PATENT DOCUMENTS

| | | | |
|---|---|---|---|
| 5,287,055 | * 2/1994 | Cini et al. | 324/768 |
| 5,381,105 | * 1/1995 | Phillips | 334/765 |
| 5,502,399 | 3/1996 | Imai | 324/765 |
| 5,654,863 | * 8/1997 | Davies | 361/111 |
| 5,770,947 | * 6/1998 | Brauchle | 324/765 |
| 5,917,319 | * 6/1999 | Frank | 324/158.1 |

FOREIGN PATENT DOCUMENTS

| | | |
|---|---|---|
| 4426307 A1 | 2/1996 | (DE). |
| 0 669 537 A1 | 8/1995 | (EP). |
| WO 95/10785 | 4/1995 | (WO). |

* cited by examiner

Primary Examiner—Safet Metjahic
Assistant Examiner—J Kerveros
(74) Attorney, Agent, or Firm—Theodore E. Galanthay; E. Russell Tarleton; Seed IP Law Group PLLC

(57) ABSTRACT

A method of testing a DMOS power transistor that includes arranging a switch between low-voltage circuitry and the gate terminal of the DMOS power transistor, maintaining the switch in an open condition, applying a stress voltage to the gate terminal, testing the functionality of the DMOS power transistor, and, if the test has a positive outcome, short-circuiting the switch through zapping by fusing a normally-open fusible link. An integrated circuit device with DMOS transistor is provided that includes a gate terminal of the DMOS transistor coupled to a control element, a normally-open switch element coupled in series between the gate terminal and the control element and including two metallic regions with an insulating between them connected in parallel with the switch element and in series between the gate terminal and the control element.

22 Claims, 2 Drawing Sheets

METHOD OF TESTING THE GATE OXIDE IN INTEGRATED DMOS POWER TRANSISTORS AND INTEGRATED DEVICE COMPRISING A DMOS POWER TRANSISTOR

TECHNICAL FIELD

The invention relates to a method of testing the gate oxide in integrated DMOS power transistors and an integrated device comprising a DMOS power transistor.

BACKGROUND OF THE INVENTION

As is known, it is desirable to be able to test and "screen" DMOS power transistors in the inspection phase by applying a stress to the gate oxide of the transistors for the purpose of reducing their failures during their operational life, by eliminating the weakest components in the inspection phase.

Furthermore, to perform validity tests in integrated power circuits, it is known to equip such circuits with dedicated contact pads to which stress voltages suitable for testing power components are applied; this technique cannot, however, be: used directly for DMOS transistors in that the high voltages that are necessary to stress the gate oxide of such components sufficiently (30 V for example) are not compatible with the control circuitry and could lead to breakage.

On the other hand, in some applications such as the motor vehicle field, it is desired to guarantee failures of operating devices tending towards 0 p.p.m. and it thus becomes increasingly necessary to have methods of test for DMOS power transistors.

SUMMARY OF THE INVENTION

An object of the invention is therefore to provide an inspection method which enables DMOS power transistors to be tested without damaging the other components of the integrated circuit.

In accordance with a method of the present invention, the gate oxide of an integrated DMOS power transistor having a gate terminal connected to a control element comprises the steps of arranging a switch element between the control element and the gate terminal of the DMOS power transistor; maintaining the switch element in an open condition; applying a stress voltage to the gate terminal; and testing the DMOS power transistor through a test condition. In another aspect of the present invention, the method includes the further step of short-circuiting the switch element that is carried out in the event the test condition is passed.

In accordance with another aspect of the present invention, the switch element comprises an electronic switch device equipped with a normally-open control terminal, and the step of maintaining the switch element comprises leaving the normally-open control terminal floating.

In accordance with a further aspect of the method of the present invention, the electronic switch device comprises a first terminal connected to the gate terminal of the DMOS power transistor and a second terminal connected to the control element, and the step of applying a stress voltage comprises the step of applying a first voltage drop between the first and second terminal with the first voltage drop having a value lower than a breakdown voltage of the electronic switch device.

In accordance with still yet another aspect of the present invention, a method of testing gate oxide of an integrated DMOS power transistor having a gates terminal and a control element is provided. The method comprises the following steps: Forming an integrated switch element between the control element and the gate terminal with at least a first terminal connected to the control element and a second terminal connected to the gate terminal; forming a normally-open fusible link across the first and second terminals of the switch element; applying a stress voltage to the gate terminal of the DMOS power transistor while maintaining the switch element in an open condition, and testing the gate oxide of the DMOS power transistor through a test condition. In accordance with another aspect of the present invention, the method comprises the further step of applying a fusion current to the fusible link to cause at least a partial fusion together of the fusible link and thereby electrically shorting the first and second terminals of the switch element and electrically connecting the control element to the gate terminal. Ideally, the step of applying a stress voltage comprises applying a first voltage drop between the first and second terminals of the switch element of a value lower than the breakdown voltage of the switch element.

In accordance with still yet a further aspect of the present invention, an integrated circuit device is provided that comprises: a DMOS power transistor having a gate terminal; a control element having at least one output; a normally-open switch element having at least first and second terminals, with the first terminal connected to the gate terminal and the second terminal connected to the output terminal of the control element for electrically isolating the control element from the DMOS power transistor; and a normally-open fusible link formed across the first and second terminals.

In accordance with a further aspect of the present invention, the fusible link includes a first conductive element connected to the first terminal of the switch element and a second conductive element connected to the second terminal of the switch element, and an insulating region between the first and second conductive elements. The switch element comprises a bipolar junction transistor having base, emitter, and collector terminals, with the base terminal being floating, the collector terminal connected to the first terminal of the switch element, and the emitter terminal connected to the second terminal of the switch element.

BRIEF DESCRIPTION OF THE DRAWINGS

For an understanding of the invention, a preferred embodiment will now be described, purely by way of non-exhaustive example, with reference to the accompanying drawings.

DETAILED DESCRIPTION OF THE INVENTION

Figure 1:
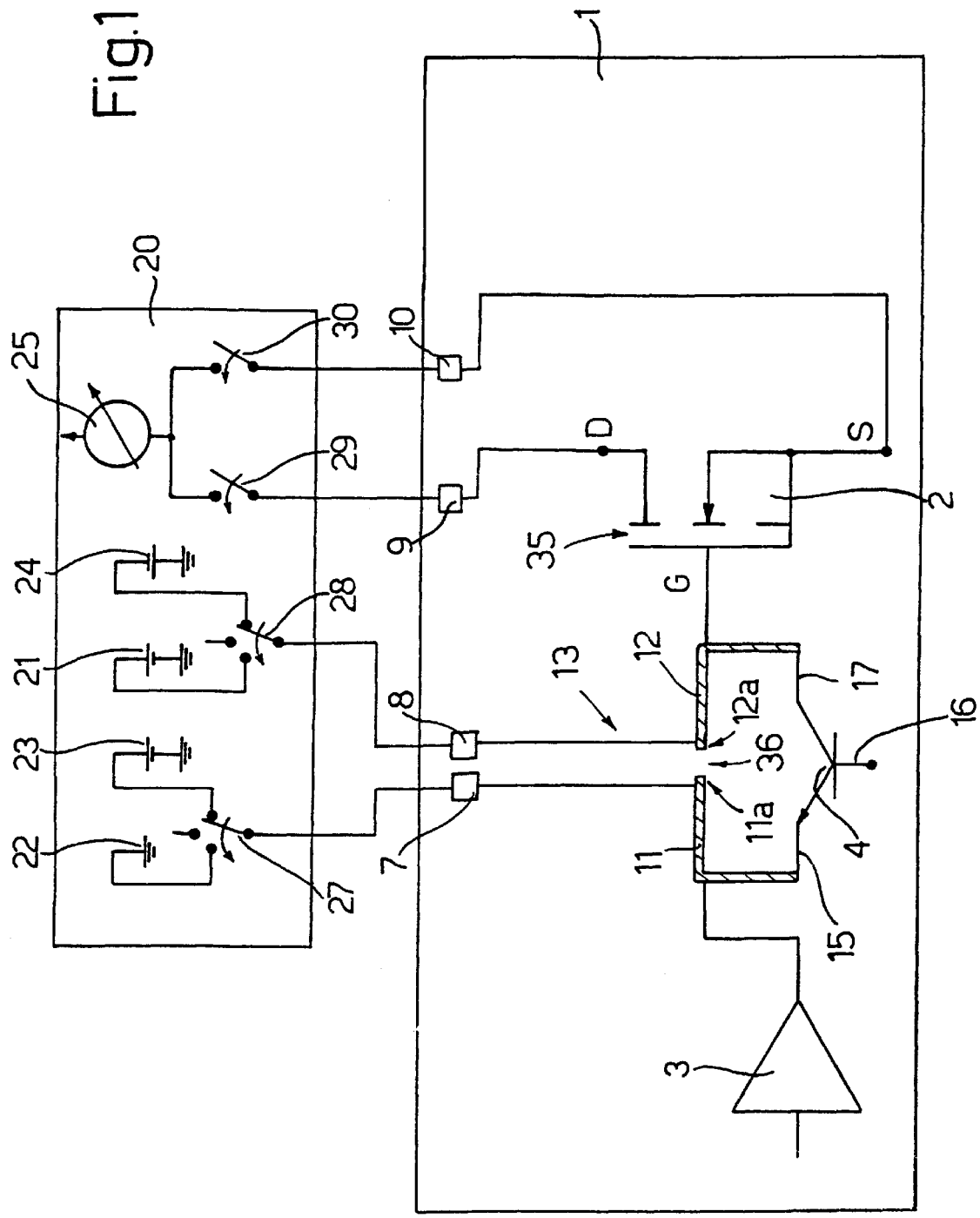
FIG. 1 shows a simplified diagram of an integrated device and an associated test device formed in accordance with the present invention.

FIG. 1 shows an integrated device 1 comprising a DMOS power transistor 2, a control element 3 of the DMOS power transistor 2, and a switch element formed here by an NPN-type bipolar transistor 4. The illustration also shows four contact pads 7–10 and two metallic regions 11, 12. In detail, the bipolar transistor 4 has an emitter terminal 15 connected to an output of the control element 3 and to the contact pad 7; a base terminal 16 is open, and a collector terminal 17 is connected to the gate terminal G of the DMOS power transistor 2 and to the contact pad 8. The DMOS power transistor 2 has the drain terminal D connected to the contact pad 9 and the source terminal S connected to the contact pad 10. The illustration also shows the gate oxide of the DMOS power transistor 2, denoted by 35. The metallic regions 11, 12, which form part of the metallization line 13 for the contact between the emitter and collector terminals of the bipolar transistor 4, are produced so as to have portions 11 a, 12a face each other, and they are typically placed at one and the same level of metallization but are electrically insulated by an insulating region (denoted diagrammatically by 36) before the test is carried out. After the testing of the DMOS power transistor 2, these metallic regions 11, 12 are intended to be physically connected to each other to obtain the short-circuit of the bipolar transistor 4 by means of the "zapping" technique as described in greater detail below.

A test device 20, which preferably forms part of a more complex test machine, of which only the components necessary for implementing this method are shown, is connected to the contact pads 7–10. The test device 20 comprises a first positive voltage generator 21; a ground line 22; a second positive voltage generator 23; a negative voltage generator 24; and a current measurement element 25. The positive voltage generators 21 and 24 may optionally be implemented by a single programmable generator. The elements 21–25 are connected selectively to the contact pads 7–10 during the test and zapping phase, as shown diagrammatically by means of switches 27–30. In particular, the switch 27 selectively connects the pad 7 to the second positive voltage generator 23, to ground line 22, or to nothing; the switch 28 selectively connects the pad 8 to the first positive voltage generator 21, to the negative voltage generator 24, or to nothing; and the switches 29 and 30 open and close the connection between the pads 9, 10 and the current measurement element 25.

Figure 2:
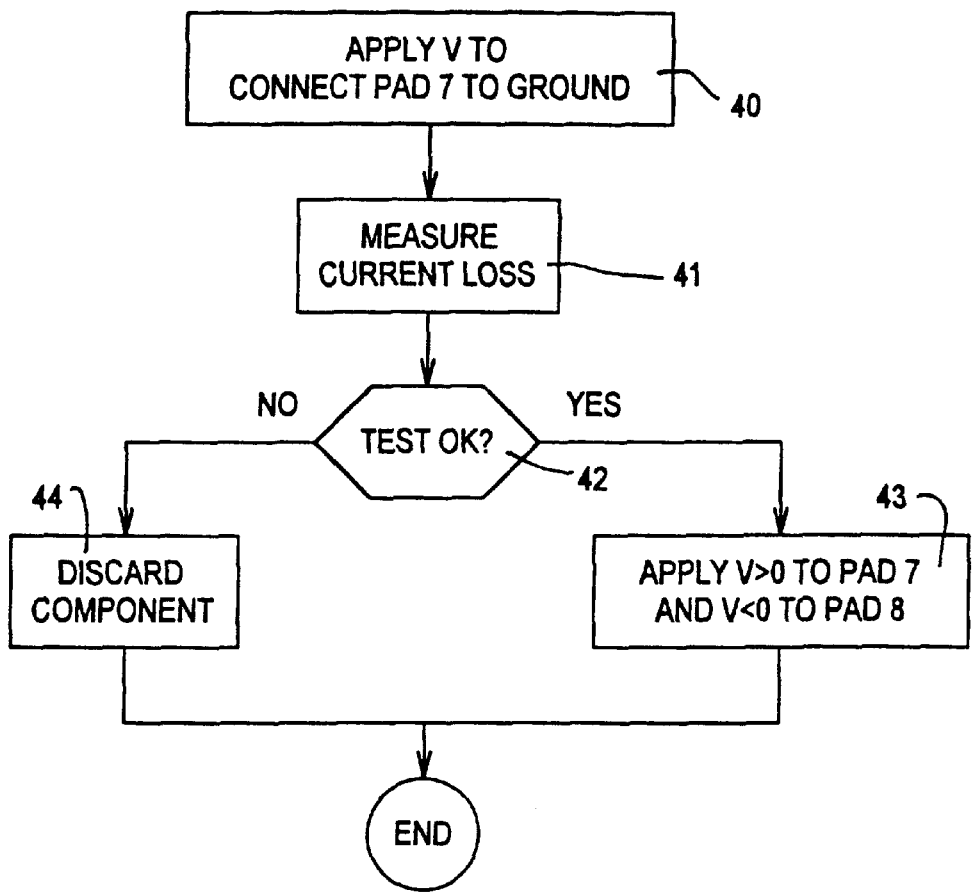
FIG. 2 shows a flow diagram relating to the method of the present invention.

The method for testing the gate oxide of the DMOS transistor is implemented preferably during the final inspection phase (EWS-Electrical Wafer Sort phase) and will now be described with reference to FIG. 2. First of all, block 40, the switches 27 and 28 are controlled so as to connect the contact pad 8 to the first positive voltage generator 21 and the contact pad 7 to ground (line 22). In this phase, the contact pads 9 and 10 remain disconnected. The first positive voltage generator 21 supplies a high stress voltage of value such as not to degrade the gate oxide 35 of the DMOS power transistor 2 but greater than the maximum operating voltage of the transistor 2 (typically equal to 5 MV/cm), 30 V for example. Furthermore, this stress voltage must be lower than the $BV_{CEO}$ value of the bipolar transistor 4. In this way, the bipolar transistor 4 is open and electrically isolates the control element 3 (Oust like the other low-voltage components of the device 1) from the gate terminal G of the DMOS power transistor 2 and from the high stress voltage.

Then, block 41, the switches 29 and 30 are closed to connect the two contact pads 9 and 10 to the two heads of the current measurement element 25 and the current loss of the DMOS power transistor 2 is measured. Alternatively, the parameters of the DMOS power transistor 2 may be measured to assess its correct functionality.

At the end of the test phase, if the DMOS power transistor 2 has passed the test (output YES from block 42), the "zapping" of the bipolar transistor 4 is carried out, block 43. For example, the switches 27 and 28 are controlled so as to connect the contact pad 7 to the second positive voltage generator 23 and the contact pad 8 to the negative voltage generator 24. The switches 29 and 30 are open. The second positive voltage generator 23 supplies a voltage lower than the critical one for the control element 3 (less than 10 V for example) and the negative voltage generator supplies a negative voltage of a few volts, so that the voltage drop between the emitter and collector terminals of the bipolar transistor 4 is greater than the inverse breakdown voltage $BV_{CEOi}$ of the bipolar transistor. Consequently, a high current begins to flow through the latter, which causes the heating and a micro-fusion of the metallic regions 11, 12 which become joined by virtue of a migration of the metallic material through the insulating region 36 interposed between them, such as to cause the short-circuit between the two said metallic regions 11, 12 and hence the formation of a single bypass region which short-circuits the bipolar transistor 4. In this way, in operating condition, the DMOS power transistor 2 is directly connected to the respective control element 3. Vice-versa, if the DMOS power transistor 2 has not passed the test, the entire integrated device 1 is discarded (block 44).

The advantages of the method and the device described emerge clearly from the description above. In particular, the fact is emphasized that the integrated device 1 permits a complete test of the functionality of the DMOS power transistor without damaging the integrated device 1. Furthermore, the integrated device requires only the additional presence of the bipolar transistor 4 and of the contact pads 7 and 8, and hence the manufacturing costs and the complexity of the device are comparable with those of current devices of the same type. The test and short-circuit procedure for the bipolar transistor 4 make use of the asymmetry properties of the breakdown voltages of the transistor 4 in open base condition and are therefore simple, can be carried out with process steps and apparatus, which are per se known in the field of semi-conductor manufacture, and are completely reliable.

Finally it will be clear that numerous modifications and variants, all of which come within the scope of the inventive concept, may be introduced to the method and the device described and illustrated here. In particular, the bipolar transistor 4 may be replaced by other components, also of other technologies, such as CMOS transistors, provided that they are capable of guaranteeing, on their own or combined with other devices, the withstanding of the stress voltage across them and the steps for testing the functionality of the DMOS power transistor after the stress test is carried out according to the desired procedures.

What is claimed is:

1. A method of testing gate oxide of an integrated DMOS power transistor having a gate terminal connected to a control element, comprising the steps of:

arranging a switch directly connected in series between said control element and said gate terminal of said DMOS power transistor;

providing first and second metallic regions with an insulating region interposed between them and directly connected in series between said control element and said gate terminal and in parallel with said switch;

maintaining said switch in an open condition;

applying a stress voltage to said gate terminal; and testing said DMOS power transistor through a test condition.

2. The method according to claim 1, further comprising a step of short-circuiting said switch by fusing said first and second metallic regions that is carried out in case said test condition is passed.

3. The method according to claim 1 wherein said switch comprises an electronic switch device equipped with a normally-open control terminal and further wherein said step of maintaining said switch element comprises leaving said normally-open control terminal floating.

4. The method according to claim 3 wherein said electronic switch device comprises a first terminal directly connected to said gate terminal of said DMOS power transistor and a second terminal directly connected to said control element and further wherein said step of applying a stress voltage comprises the step of applying a first voltage drop between said first and second terminal with the first voltage drop having a value lower than a breakdown voltage of said electronic switch device.

5. The method according to claim 4 wherein said step of applying a first voltage drop comprises the step of applying a positive voltage to said first terminal with respect to said second terminal.

6. The method according to claim 1 wherein said step of testing comprises the step of measuring a current loss of said DMOS power transistor.

7. The method according to claim 2 wherein said switch comprises an electronic switch device equipped with a first and a second terminal connected to the first and second metallic regions respectively, said first and second metallic regions face each other and are electrically insulated from each other by means of the insulating portion, said step of short-circuiting comprising the step of supplying a fusion current to said first and second metallic regions such as to cause an at least partial fusion of said metallic regions and a permanent physical connection between said first and second metallic regions.

8. The method according to claim 7 wherein said electronic switch device comprises a normally-open control terminal and said step of supplying a fusion current comprises the steps of applying a second voltage drop between said first and second terminals that is greater than a breakdown voltage of said electronic switch device and leaving said normally-open control terminal floating.

9. The method according to claim 8 wherein said step of applying a second voltage drop comprises the step of applying a positive voltage to said second terminal with respect to said first terminal.

10. An integrated circuit having a DMOS power transistor with a gate terminal coupled to a control element, the integrated circuit device comprising a normally-open switch means having an electronic switch device connected in series between the gate terminal and the control element and having a first terminal and a second terminal directly connected respectively to said gate terminal and to said control element, the switch means further comprising first and second metallic regions with an insulating layer interposed between them, the first and second metallic regions connected in series between the gate terminal and the control element and in parallel with the electronic switch device.

11. The device according to claim 10 wherein said switch means is directly connected to the gate terminal and the control element without any intervening resistive element.

12. The device according to claim 11 wherein said first and a second metallic regions each comprise a contact metallization line of said electronic switch device and having mutually facing portions that are electrically separated by an insulating region and are intended to form a single by-pass region further to a controlled fusion step.

13. The device according to claim 12, further comprising a first and a second contact pad connected to said first and, respectively, said second terminal through said second and, respectively, said first metallic region.

14. The device according to claim 11 wherein said electronic switch means comprises a bipolar transistor having base, emitter and collector terminals, said base terminal being floating, said collector terminal directly connected to said first terminal and said emitter terminal directly connected to said second terminal of said switch means.

15. A method of testing gate oxide of an integrated DMOS power transistor having a gate terminal and a control element, the method comprising:

forming an integrated switch in series between the control element and the gate terminal with at least a first terminal directly connected to the control element and a second terminal directly connected to the gate terminal without any intervening resistive component;

forming a normally-open fusible link in parallel across the first and second terminals of the switch element and in series with the control element and the gate terminal;

applying a stress voltage to the gate terminal of the DMOS power transistor while maintaining the switch in an open condition; and testing the gate oxide of the DMOS power transistor through a test condition.

16. The method of claim 15, comprising the further step of applying a fusion current to said fusible link to cause at least a partial fusion together of the fusible link and thereby electrically shorting the first and second terminals of the switch and electrically connecting the control element to the gate terminal.

17. The method of claim 16 wherein said step of applying a stress voltage comprises applying a first voltage drop between the first and second terminals of the switch of a value lower than the breakdown voltage of the switch.

18. An integrated circuit, comprising:

a DMOS power transistor having a gate terminal;

a control element having at least one output terminal;

a normally-open switch element connected in series between the DMOS power transistor and the control element and having at least first and second terminals, with said first terminal directly connected to said gate terminal and said second terminal directly connected to said output terminal of said control element, and a control terminal that is normally open for electrically isolating said control element from said DMOS power transistor; and a normally-open fusible link formed in parallel across said first and second terminals and in series between the gate terminal and the output terminal, said fusible link includes a first metallic element connected to said first terminal of said switch element and a second metallic element connected to said second terminal of said switch element, and an insulating, region between said first and second metallic elements.

19. The device of claim 18 wherein said switch element comprises a bipolar junction transistor having base, emitter, and collector terminals, said base terminal being floating, said collector terminal connected to said first terminal of said switch element, and said emitter terminal connected to said second terminal of said switch element.

20. A method of testing gate oxide of an integrated DMOS power transistor having a gate terminal connected to a control element by a switch directly connected in series between the control element and the gate terminal of the DMOS power transistor and first and second metallic regions with an insulating region interposed between them and directly connected in series between the control element and the gate terminal and in parallel with the switch, the method comprising:

maintaining the switch in an open condition;

applying a stress voltage to the gate terminal;

testing the DMOS power transistor through a test condition; and fusing the first and second metallic regions when the test condition is met by applying power to the switch in parallel with the first and second metallic regions that is less than the breakdown voltage of the switch but sufficient to heat the first and second metallic regions to a molten temperature.

21. A method of testing gate oxide of an integrated DMOS power transistor having a gate terminal connected to a control element, comprising:

providing a switch directly connected in series between the control element and gate terminal of the DMOS power transistors;

providing first and second metallic regions with an insulating region interposed between them and directly connected in series between the control element and the gate terminal and in parallel with the switch;

maintaining the switch in an open condition;

applying a stress voltage to the gate terminal;

testing the DMOS power transistor through a test condition; and fusing the first and second metallic regions when the test condition is met by applying power to the switch in parallel with the first and second metallic regions that is less than the breakdown voltage of the switch but sufficient to heat the first and second metallic regions to a molten temperature.

22. The method of claim 21, wherein providing the switch that is directly connected in series between the control element and the gate terminal comprises providing the switch directly connected in series between the control element and the gate terminal without any intervening resistive component.

* * * * *